(12) United States Patent
Hung et al.

(10) Patent No.: US 10,105,732 B2
(45) Date of Patent: Oct. 23, 2018

(54) COATER AND SURFACE TREATMENT METHOD

(71) Applicant: TAIWAN SEMICONDUCTOR MANUFACTURING CO., LTD., Hsinchu (TW)

(72) Inventors: Ming-Hsiang Hung, New Taipei (TW); Teng-Yi Huang, Tainan (TW); Fu-Jen Tien, Tainan (TW); Li-Jen Wu, Tainan (TW); Cheng-Ming Wu, Tainan (TW); Teng-Hwee Ng, Tainan (TW); Ming-Yang Chuang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/988,677

(22) Filed: Jan. 5, 2016

(65) Prior Publication Data
US 2017/0189932 A1     Jul. 6, 2017

(51) Int. Cl.
| | |
|---|---|
| *B05C 5/02* | (2006.01) |
| *B05C 19/00* | (2006.01) |
| *B05C 11/08* | (2006.01) |
| *H01L 21/00* | (2006.01) |
| *H01L 21/67* | (2006.01) |
| *B05B 14/44* | (2018.01) |

(52) U.S. Cl.
CPC ............ *B05C 19/008* (2013.01); *B05B 14/44* (2018.02); *B05C 5/02* (2013.01); *B05C 11/08* (2013.01); *H01L 21/00* (2013.01); *H01L 21/6715* (2013.01); *H01L 21/67017* (2013.01)

(58) Field of Classification Search
CPC ......... B05C 5/02; B05C 11/08; B05C 19/008; G03F 7/162; G03F 7/3021; H01L 21/67178; H01L 21/6715; H01L 21/67017; H01L 21/00; H01L 21/02282; B05D 1/005; B05D 3/12; B05B 14/44
USPC ...... 118/52, 56, 319, 320; 134/902; 524/462
See application file for complete search history.

(56) References Cited

U.S. PATENT DOCUMENTS

| | | | | |
|---|---|---|---|---|
| 5,672,832 A | * | 9/1997 | Cucci | G01F 1/363 73/706 |
| 6,159,288 A | * | 12/2000 | Satou | B05C 11/08 118/52 |
| 6,176,198 B1 | * | 1/2001 | Kao | C23C 16/4405 118/723 ME |
| 7,311,781 B2 | * | 12/2007 | Tokuri | G03F 7/162 118/320 |
| 7,337,677 B2 | * | 3/2008 | Mizohata | G01F 1/48 73/861.52 |
| 7,694,650 B2 | * | 4/2010 | Huang | H01L 21/67253 118/319 |

(Continued)

*Primary Examiner* — Laura Edwards
(74) *Attorney, Agent, or Firm* — Maschoff Brennan

(57) ABSTRACT

A coater includes a chuck, a source of a coating material, a dispensing head, an exhaust system, and a liner. The chuck is configured to support a wafer. The dispensing head is configured to dispense the coating material onto the wafer. The exhaust system is configured to exhaust the excess coating material. The liner is present at least partially on an inner surface of the exhaust system. The liner has a stick resistance to the coating material, and the stick resistance of the liner is greater than a stick resistance of the inner surface of the exhaust system.

14 Claims, 4 Drawing Sheets

(56) References Cited

U.S. PATENT DOCUMENTS

| | | | | |
|---|---|---|---|---|
| 8,147,915 B2* | 4/2012 | Bate | ............... | C08L 71/02 |
| | | | | 427/207.1 |
| 8,181,593 B2* | 5/2012 | DeMuynck | ............ | B05D 3/002 |
| | | | | 118/313 |
| 8,371,318 B2* | 2/2013 | Minami | ............ | H01L 21/67028 |
| | | | | 134/902 |
| 2003/0221708 A1* | 12/2003 | Ly | ............... | C23C 16/4405 |
| | | | | 134/18 |
| 2012/0240853 A1* | 9/2012 | Carlson | ............... | C23C 16/4404 |
| | | | | 118/715 |

* cited by examiner

COATER AND SURFACE TREATMENT METHOD

BACKGROUND

In the semiconductor processing industry, a photoresist is applied to a semiconductor wafer by means of a spin coating machine. The wafer is placed on a flat vacuum chuck and spun slowly while the photoresist is applied through a nozzle near the center of the wafer. When the wafer is spun at high speed, centrifugal force causes the photoresist to flow towards the circumference of the wafer, thereby covering the surface of the wafer with a smooth, even coat of photoresist. Excess photoresist flows off the edge of the wafer, and is collected and disposed of.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
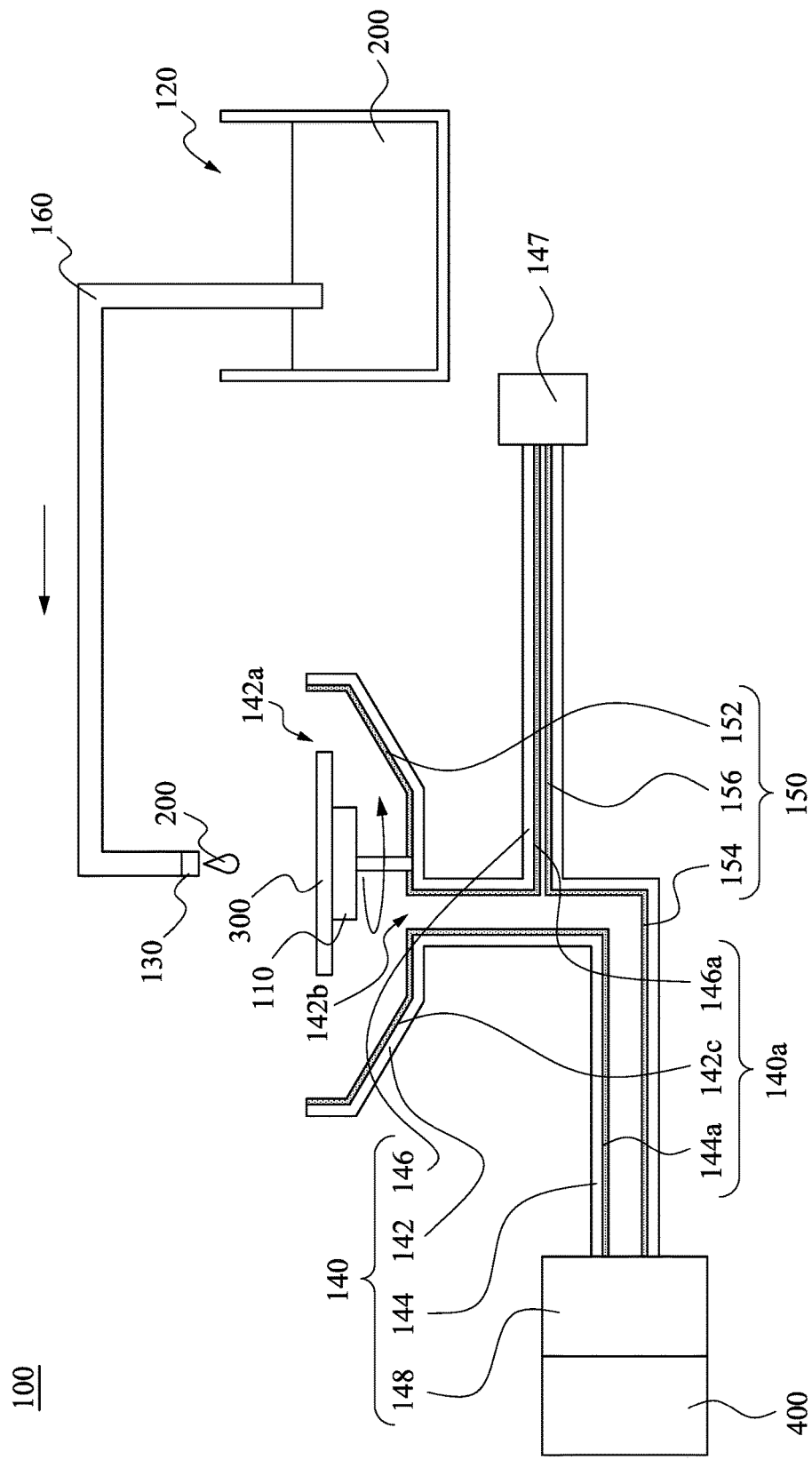
FIG. 1 is a cross-sectional view of a coater according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a coater 100 according to some embodiments of the present disclosure. The coater 100 includes a chuck 110, a source 120 of a coating material 200, a dispensing head 130, an exhaust system 140, and a liner 150. The chuck 110 is configured to support a wafer 300. The dispensing head 130 is configured to dispense the coating material 200 onto the wafer 300. The exhaust system 140 is configured to exhaust the excess coating material 200. The liner 150 is present at least partially on an inner surface 140a of the exhaust system 140. The liner 150 has a stick resistance to the coating material 200, and the stick resistance of the liner 150 is greater than that of the inner surface 140a of the exhaust system 140.

In some embodiments of the present disclosure, the coating material 200 may be a liquid photoresist, a liquid polyimide, or other fluids. In some embodiments of the present disclosure, the coating material 200 may be more glutinous than water.

In some embodiments of the present disclosure, the coater 100 further includes a dispensing arm 160 extendable over the chuck 110. The dispensing arm 160 may include a tube connecting the source 120 and the dispensing head 130, such that the coating material 200 may flow from the source 120 through the dispensing arm 160 to the dispensing head 130, and then be dispensed onto the wafer 300.

The exhaust system 140 may also be considered a fluid transportation mechanism offering various functions, such as collecting the excess coating material 200, transporting the excess coating material 200, monitoring the pressure of gases in the exhaust system 140, and monitoring the flow rate of the exhaust gases.

In greater detail, in some embodiments of the present disclosure, the exhaust system 140 may include a cup 142, an exhaust pipe 144, a sampling pipe 146, a pressure sensor 147, and an exhaust fan 148. It is noted that one or more elements, such as the sampling pipe 146, the pressure sensor 147, or the exhaust fan 148, may be optional for the exhaust system 140, and such elements should not be construed as limitations of the exhaust system 140.

The cup 142 is at least partially present below the chuck 110. In some embodiments of the present disclosure, the cup 142 may surround the chuck 110 and the wafer 300. The cup 142 has an opening 142a on the top thereof and a drain opening 142b on the bottom thereof. The opening 142a is formed above the chuck 110 such that the dispensing head 130 may inject the coating material 200 onto the wafer 300 by gravity through the opening 142a. The drain opening 142b is formed below the chuck 110 such that a liquid in the cup 142, such as the excess coating material 200, may flow to the drain opening 142b and exit from the cup 142 by gravity (and in reaction to suction forces).

In some embodiments of the present disclosure, the exhaust pipe 144 fluidly communicates with the drain opening 142b. In some embodiments of the present disclosure, one end of the exhaust pipe 144 is connected to the drain opening 142b, and the other end of the exhaust pipe 144 may be connected to a collection tank 400 for disposing of the excess coating material 200. The exhaust fan 148 or another aspirator(s) (not shown) may be connected with the exhaust pipe 144 and fluidly communicates with the exhaust pipe 144 for creating suction forces in the exhaust inlets of the exhaust system 140. Through such a configuration, the excess coating material 200 may be drawn from the cup 142 and expelled out of the exhaust system 140.

In some embodiments of the present disclosure, the sampling pipe 146 fluidly communicates with the exhaust pipe 144. For example, as shown in FIG. 1, the sampling pipe 146 is connected to the exhaust pipe 144, and may have a smaller diameter than that of the exhaust pipe 144. The sampling pipe 146 may be connected to the pressure sensor 147 of the exhaust system 140. In some embodiments of the present disclosure, the pressure sensor 147 fluidly communicates with the sampling pipe 146 to measure a pressure of the exhaust pipe 144.

In a coating operation process, the coating material 200 is sent from the source 120 to the dispensing head 130. The chuck 110 rotates the wafer 300 at high speeds, typically as high as about 100 to 2000 rpm, within a stationary bowl or the cup 142. The wafer 300 may be rotated, either after or as the coating material 200 is dispensed onto the center of the wafer 300 through the opening 142*a* of the cup 142, by operation of the dispensing arm 160. The coating material 200 dispensed onto the center of the wafer 300 is spread outwardly toward the edges of the wafer by surface tension generated by the centrifugal force of the rotating wafer 300, such that the coating material 200 is uniformly coated on the surface of the wafer 300. The cup 142 catches the excess coating material 200 ejected from the rotating wafer 300. The excess coating material 200 generated during the process and collected by the cup 142 is vented from the cup 142 through the exhaust pipe 144, which may be connected to the collection tank 400.

In some embodiments of the present disclosure, the cup 142 is made of poly(phenyl ether) (PPE), and the exhaust pipe 144 and the sampling pipe 146 may be made of stainless steel. A water contact angle on the inner surface 140*a* of the exhaust system 140 (which may include the inner surface 142*c* of the cup 142, the inner surface 144*a* of the exhaust pipe 144, and the inner surface 146*a* of the sampling pipe 146) may be less than 110 degrees. To be specific, the water contact angle on the inner surface 140*a* may be in a range from about 25 degrees to about 38 degrees.

In absence of the liner, since the coating material may be in contact with the inner surface of the cup and the pipes, the coating material may stick to the inner surface of the cup and the pipes. As a result, a residue of the coating material may be formed on the inner surface of the exhaust system. Over the long term, the residue of the coating material may clog the exhaust system of the coater.

In some embodiments of the present disclosure, the liner 150 is present on the inner surface 140*a* of exhaust system 140 for isolating the inner surface 140*a* from the coating material 200. In some embodiments of the present disclosure, the liner 150 is made of a hydrophobic material. In some embodiments of the present disclosure, the liner 150 is made of a material including fluorine, such as a fluorocarbon-based polymer. The liner 150 may have a water contact angle greater than that of the inner surface 140*a* of the exhaust system 140. For example, a water contact angle on the surface of the liner 150 may be in a range from about 100 to about 120 degrees, such as from about 110 degrees to about 115 degrees. As a result of such a configuration, the stick resistance of the liner 150 is greater than that of the inner surface 140*a* of the exhaust system 140.

During the coating process, since the coating material 200 is in contact with the liner 150 having a good stick resistance instead of the surface 140, clogging of the exhaust system 140 occurs less easily. In addition, after the coating process, the exhaust system 140 may be flushed with a cleaning liquid, such as Reducing Resist Consumption (RRC) solvents. Through the presence of the liner 150, the adhesion force between the exhaust system 140 and the residue of the coating material 200 is made smaller, and therefore the residue of the coating material 200 may be easily removed from the liner 150 by the flushing process.

The liner 150 will be described in greater detail. The liner 150 may include a first portion 152, a second portion 154, and a third portion 156. The first portion 152 is present on the inner surface 142*c* of the cup 142, and has a greater water contact angle than that of the inner surface 142*c* of the cup 142. The second portion 154 is present on the inner surface 144*a* of the exhaust pipe 144, and has a greater water contact angle than that of the inner surface 144*a* of the exhaust pipe 144. The third portion 156 is present on the inner surface 146*a* of the sampling pipe 146, and has a greater water contact angle than that of the inner surface 146*a* of the sampling pipe 146.

In some embodiments of the present disclosure, the first portion 152, the second portion 154, and the third portion 156 respectively isolate the inner surface 142*c*, the inner surface 144*a*, and the inner surface 146*a* from the coating material 200.

In some embodiments of the present disclosure, the liner 150 may wholly cover the inner surface 140*a*. That is, the first portion 152, the second portion 154, and the third portion 156 wholly cover the inner surface 142*c*, the inner surface 144*a*, and the inner surface 146*a* respectively.

However, the configuration of the liner 150 should not limit the scope of the present disclosure. Though not depicted, in some embodiments of the present disclosure, the liner 150 may partially cover the inner surface 140*a* of the exhaust system 140. For example, the second portion 154 and the third portion 156 may wholly cover the inner surface 144*a* and the inner surface 146*a* respectively, but the first portion 152 partially covers the inner surface 142*c* of the cup 142. The first portion 152 covers a sidewall of the cup 142 and has a height greater than the height of the chuck 110. In some embodiments of the present disclosure, the height of the first portion 152 may be configured based on sizes of the cup 142 and the chuck 110, the coating material 200, and the rotation speed, such that the excess coating material 200 ejected from the rotating wafer 300 is prevented from splattering the inner surface 142*c* of the cup 142. Therefore, the inner surface 142*c* of the cup 142 may be partially exposed but prevented from being in contact with the excess coating material 200.

In this embodiment, the first portion 152, the second portion 154, and the third portion 156 are connected, such that all of the inner surface 140*a* of the exhaust system 140 is prevented from being exposed to or in contact with the coating material 200. However, such a configuration of the liner 150 should not limit the scope of the present disclosure. In other embodiments, though not shown herein, the first portion 152, the second portion 154, and the third portion 156 may not be connected, and the exhaust system 140 may be partially exposed to or in contact with the coating material 200. In other words, in an actual application, the liner 150 may be present on a portion of the inner surface 140*a*. For example, the liner 150 may be present on one or two of the inner surface 142*c* of the cup 142, the inner surface 144*a* of the exhaust pipe 144, and the inner surface 146*a* of the sampling pipe 146.

In some embodiments of the present disclosure, the first portion 152, the second portion 154, and the third portion 156 may be made of the same or different materials. The materials of the first portion 152, the second portion 154, and the third portion 156 may be chosen to have an adequate stick resistance according to the coating material 200 and the materials of the inner surfaces 140*a* of the exhaust system 140. To be specific, the stick resistance of the first portion 152 of the liner 150 is greater than that of the inner surface 142*c* of the cup 142. The stick resistance of the second portion 154 of the liner 150 is greater than that of the inner surface 144*a* of the exhaust pipe 144. The stick resistance of the third portion 156 of the liner 150 is greater than that of the inner surface 146a of the sampling pipe 146.

Also, though the first portion 152, the second portion 154, and the third portion 156 are depicted with the same thickness, in practice, the first portion 152, the second portion 154, and the third portion 156 may have different thicknesses.

In some embodiments of the present disclosure, the sampling pipe 146 and the pressure sensor 147 are utilized for monitoring and checking the extent of the obstruction. Herein, the sampling pipe 146 sends the gases in the exhaust pipe 144 to the pressure sensor 147, and the pressure sensor 147 measures the pressure of gases in the exhaust pipe 144.

Under normal conditions in which the exhaust system 140 (which includes at least the cup 142 and the exhaust pipe 144) is substantially devoid of a residue of coating material 200 or deposits which would otherwise hinder the free flow of exhaust gas from the cup 142 through both the drain opening 142b thereof and through the exhaust pipe 144, a pressure of the exhaust gases as measured by the pressure sensor 147 in the exhaust pipe 144 is substantially in a normal range. However, if the measured pressure of the exhaust gases in the exhaust pipe 144 is out of the normal range, this is indicative of an abnormal condition in the exhaust pipe 144, such as a buildup of photoresist or accumulation of photoresist particles partially or completely obstructing the exhaust system 140, for example. Measures may then be taken to remove the photoresist, photoresist particles, or other obstructions from the inner surfaces 140a of the exhaust system 140.

In an ideal operation process, the coating material 200 does not enter the sampling pipe 146. However, in practice, a small amount of the coating material 200 may still enter the sampling pipe 146, for example, as a result of a capillary effect. In the embodiments of the present disclosure, the third portion 156 is disposed on the inner surface 146a of the sampling pipe 146, such that the small amount of the coating material 200 entering the sampling pipe 146 may be removed easily.

In some embodiments of the present disclosure, a flow sensor (not shown) measuring the flow rate of exhaust gases may be connected with the sampling pipe 146 and used in place of the pressure sensor 147 for monitoring and checking the extent of the obstruction. It is noted that the pressure sensor 147 or the flow sensor (not shown) illustrated herein should not limit the scope of the present disclosure, and various known techniques may be implemented herein for monitoring the extent of the obstruction.

Also, in addition to the configuration of monitoring the extent of the obstruction, the coater 100 may have some other configuration having a portion of the liner 150 therein. One of ordinary skill in the art would appreciate that the liner 150 may be configured for also isolating such additional surfaces of the coater 100 from the coating material 200.

FIG. 2A to FIG. 2E are cross-sectional views of an exhaust component 500 at plural stages of a surface treatment method according to some exemplary embodiments of the present disclosure. In some embodiments of the present disclosure, the exhaust component 500 is utilized for assembly to a coater.

Figure 2B:
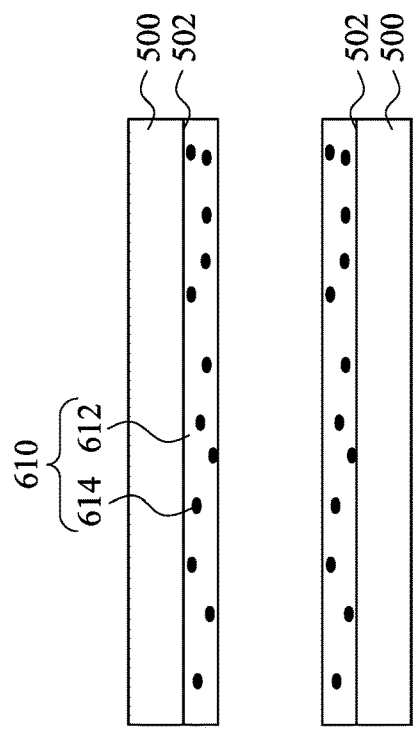
FIG. 2A to FIG. 2E are cross-sectional views of an exhaust component at plural stages of a surface treatment method according to some embodiments of the present disclosure.
Figure 2A:
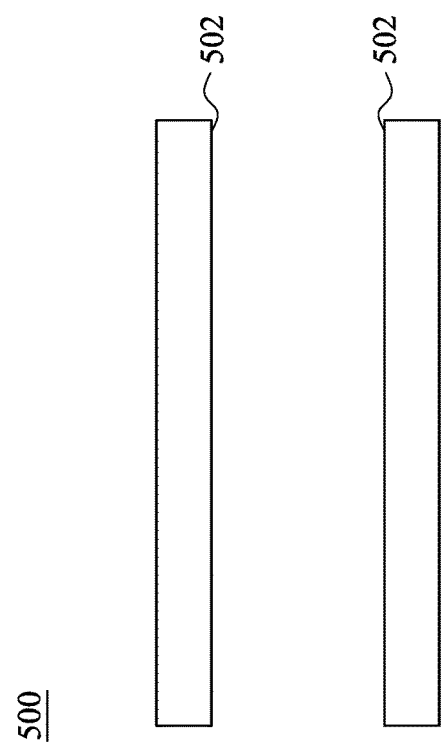

Referring to FIG. 2A, the exhaust component 500 is provided. The exhaust component 500 is configured to process a flowable material (such as the excess coating material 200 shown in FIG. 1). For example, the exhaust component 500 may be utilized for collecting or transporting the flowable material. Herein, the exhaust component 500 is depicted as a tube having an inner surface 502. In some embodiments of the present disclosure, the exhaust component 500 may be used as one of the cup 142, the exhaust pipe 144, and the sampling pipe 146 of the coater 100 (see FIG. 1).

Subsequently, referring to FIG. 2B, a first coating 610 is applied at least onto the inner surface 502 of the exhaust component 500. The first coating 610 may include a first solvent 612 and first particles 614 spreading or dissolving in the first solvent 612. For example, the first solvent 612 may be ionic liquid, absolute alcohol, and so on. The first particles 614 may be fluorocarbon-based polymer, and so on.

There are various methods for applying the first coating 610 onto the inner surface 502 of the exhaust component 500. According to the size of the exhaust component 500, two exemplary methods are illustrated herein.

In the case where the exhaust component 500 is large (for example, at least one of the length, the width, and the height of the exhaust component 500 is more than about 100 millimeters), a brush coating method may be implemented. A brush (not shown) may be first wetted by the first coating 610, and then inserted into the exhaust component 500 for brushing the inner surface 502 of the exhaust component 500. Through such a process, the first coating 610 may be brushed onto the inner surface 502 of the exhaust component 500.

In the case where the exhaust component 500 is small (for example, one of the length, the width, and the height of the exhaust component 500 is less than 100 millimeters), a soaking method may be implemented. A bowl (not shown) may be filled with the first coating 610 to a level greater than the height of the exhaust component 500, and the exhaust component 500 may be put in the bowl and soaked in the first coating 610. Due to the surface tension of the first coating 610 on the inner surface 502, when the exhaust component 500 is taken out from the bowl, the first coating 610 may adhere to the inner surface 502 of the exhaust component 500. Through such a process, a layer of the first coating 610 may remain on the inner surface 502 of the exhaust component 500.

It is noted that the methods shown herein should not limit the scope of the present disclosure, and other methods may be utilized for applying the first coating 610 onto the inner surface 502.

Figure 2D:
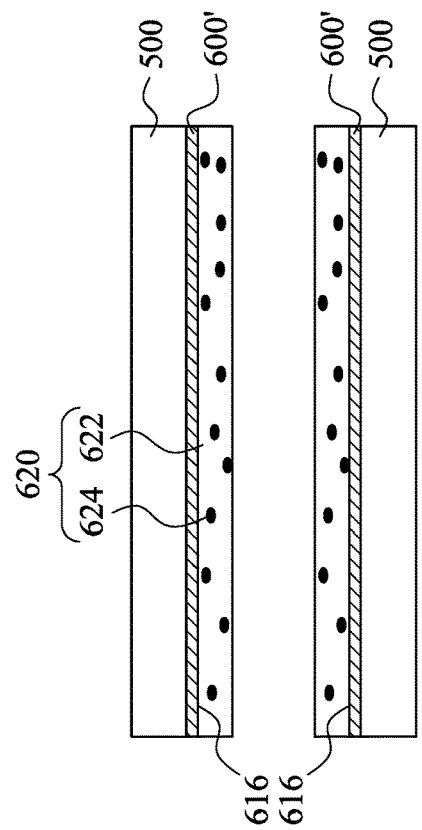
Figure 2C:
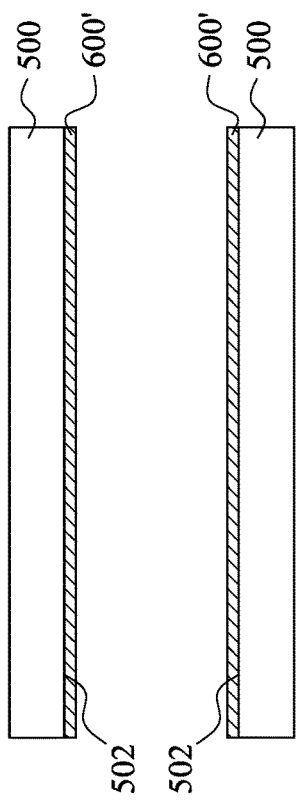

Next, referring to FIG. 2C, the first solvent 612 in the first coating 610 (see FIG. 2B) is removed to form a liner 600'. In some embodiments of the present disclosure, there are a variety of methods for removing the first solvent 612 in the first coating 610 (see FIG. 2B). In an example, the first solvent 612 (see FIG. 2B) in the exhaust component 500 may be air-dried at room temperature. In another example, the exhaust component 500 may be baked in an oven at a predetermined temperature range, such as from about 80 to about 150 degrees Celsius. As a result, the first solvent 612 may evaporate from the first coating 610 (see FIG. 2B), and the liner 600' is formed the inner surface 502 of the exhaust component 500. Other drying methods may also be utilized by for removing the first solvent 612 in the first coating 610.

In some embodiments of the present disclosure, the material of the first coating 610 (see FIG. 2B) is chosen such that the liner 600' obtained therefrom is hydrophobic. For example, the material of the first coating 610 (see FIG. 2B) is chosen such that a water contact angle on the surface of the liner 600' may be in a range from about 100 to about 120 degrees, such as from about 110 degrees to about 115 degrees.

Herein, the exhaust component 500 with the liner 600' therein is obtained. The thickness of the liner 600' may be dependent on the surface tension between the first coating 610 (see FIG. 2B) and the inner surface 502 of the exhaust component 500. Sometimes, the thickness may be slightly too low for application, resulting in problems, such as peeling off. For increasing the thickness of the liner 600', the processes of FIG. 2D and FIG. 2E may be performed.

Referring to FIG. 2D, a second coating 620 is applied onto the inner surface (the surfaces 616 of the liner 600') of the exhaust component 500. The second coating 620 may include a second solvent 622, and second particles 624 that spread or dissolve in the second solvent 622. For example, the second solvent 622 may be ionic liquid, absolute alcohol, and so on. The second particles 624 may be a fluorocarbon-based polymer, and so on. Herein, the material and composition of the second coating 620 may be the same as or different from the material and composition of the first coating 610 (see FIG. 2B).

As in the case of the first coating 610 (see FIG. 2B), the brush coating or the soaking method may be utilized for applying the second coating 620 onto the inner surface 502. The relevant details are similar to those of the first coating 610 (see FIG. 2B), and therefore will not be repeated.

Figure 2E:
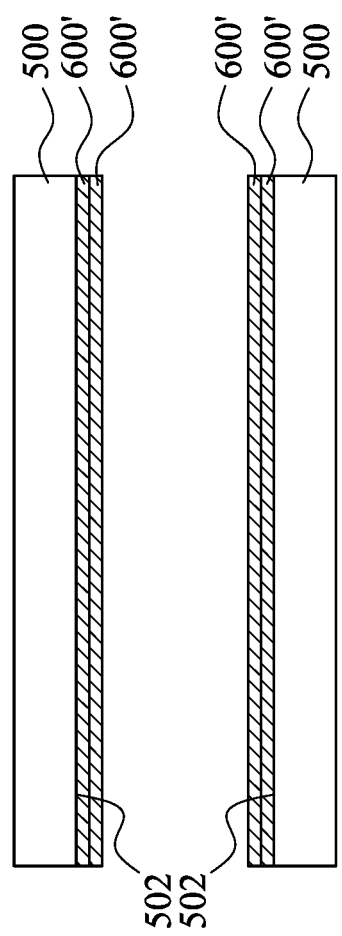

Next, referring to FIG. 2E, a second solvent 622 in the second coating 620 (see FIG. 2D) is removed to thicken the liner 600'. As described in relation to the first coating 610 (see FIG. 2B), the method for removing the second solvent 622 in the second coating 620 (see FIG. 2D) may include air-drying or oven-baking. The relevant details are similar to those of the first coating 610 (see FIG. 2B), and therefore will not be repeated.

As a result, the liner 600' includes two layers and becomes thicker. Though only the formation of the two layers of the liner 600' are described herein, such a configuration should not limit the scope of the present disclosure. In some embodiments of the present disclosure, the liner 600' may include more than two layers, and the steps of applying, coating, and drying the coating are repeated several times. On the other hand, in some embodiments of the present disclosure, the steps shown in FIGS. 2D and 2E may be omitted, and the exhaust component 500 may be coated with only one layer of the liner 600'.

After the formation of the liner 600', the exhaust component 500 is assembled onto a coater (see FIG. 1). Through such a configuration, when a flowable liquid flows through the exhaust component 500, the liner 600' may isolate the flowable liquid from being in contact with the inner surface 502 of the exhaust component 500, and the problem of obstruction may be reduced.

According to some embodiments of the present disclosure, a coater includes a chuck, a source of a coating material, a dispensing head, an exhaust system, and a liner. The chuck is configured to support a wafer. The dispensing head is configured to dispense the coating material onto the wafer. The exhaust system is configured to exhaust the excess coating material. The liner is present at least partially on an inner surface of the exhaust system, wherein the liner has a stick resistance to the coating material, and the stick resistance of the liner is greater than that of the inner surface of the exhaust system.

According to some embodiments of the present disclosure, a coater includes a chuck, a source of a coating material, a dispensing head, a drain opening, a fluid transportation mechanism, and a liner. The chuck is configured to support a wafer. The dispensing head is configured to dispense the coating material onto the wafer. The drain opening is present below the chuck. The fluid transportation mechanism fluidly communicates with the drain opening. The liner is present at least partially on an inner surface of the fluid transportation mechanism. The liner has a water contact angle greater than that of the inner surface of the fluid transportation mechanism.

According to some embodiments of the present disclosure, a surface treatment method includes: forming a liner at least on an inner surface of an exhaust component, in which the liner is made of a material having a water contact angle greater than that of the inner surface of the exhaust component; and assembling the exhaust component is onto a coater.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A coater, comprising:
   a chuck configured to support a wafer;
   a source of a coating material;
   a dispensing head configured to dispense the coating material onto the wafer;
   an exhaust system configured to exhaust the excess coating material, wherein the exhaust system comprises an exhaust pipe below the chuck;
   a pressure sensor coupled to the exhaust pipe through a sampling pipe and configured to monitor an extent of clogging in the exhaust pipe, wherein the sampling pipe has a smaller diameter than the exhaust pipe; and
   a liner at least partially on an inner surface of the exhaust pipe, wherein the liner has a stick resistance to the coating material, and the stick resistance of the liner is greater than a stick resistance of the inner surface of the exhaust pipe to the coating material.

2. The coater of claim 1, wherein the liner is made of a hydrophobic material.

3. The coater of claim 1, wherein the liner is made of a material comprising fluorine.

4. The coater of claim 1, wherein the liner is made of a material comprising a fluorocarbon-based polymer.

5. The coater of claim 1, wherein the exhaust system comprises a drain opening present below the chuck and fluidly communicating with the exhaust pipe.

6. The coater of claim 1, wherein the exhaust system further comprises:
   an exhaust fan fluidly communicating with the exhaust pipe.

7. The coater of claim 1, wherein the exhaust system comprises a cup below the chuck and having a drain opening therein, the liner is at least on an inner surface of the cup, and the stick resistance of the liner is greater than a stick resistance of the inner surface of the cup to the coating material.

8. The coater of claim 1, wherein the exhaust system comprises a drain opening present below the chuck and fluidly communicating with the exhaust pipe, wherein the sampling pipe is fluidly communicating with the exhaust pipe, the liner is at least on an inner surface of the sampling pipe, and the stick resistance of the liner is greater than a stick resistance of the inner surface of the sampling pipe to the coating material.

9. The coater of claim 8, wherein the liner on the inner surface of the exhaust pipe is a first liner and the liner on the inner surface of the sampling pipe is a second liner and the first liner and the second liner are made of different materials.

10. The coater of claim 1, wherein the sampling pipe is free of the liner.

11. The coater of claim 1, wherein the exhaust system comprises a cup surrounding the chuck and free of the liner.

12. A coater, comprising:
a chuck configured to support a wafer;
a cup surrounding the chuck and having an opening, wherein a center of the chuck is offset from a center of the opening of the cup;
a source of a coating material;
a dispensing head configured to dispense the coating material onto the wafer;
a drain opening below the chuck;
a fluid transportation mechanism fluidly communicating with the drain opening; and
a liner on an inner surface of the fluid transportation mechanism, wherein the liner has a first coating that is on the inner surface of the fluid transportation mechanism and that has a water contact angle greater than a water contact angle of the inner surface of the fluid transportation mechanism.

13. The coater of claim 12, wherein the fluid transportation mechanism comprises an exhaust pipe fluidly communicating with the drain opening, the liner is at least on an inner surface of the exhaust pipe, and the water contact angle of the first coating is greater than a water contact angle of the inner surface of the exhaust pipe.

14. The coater of claim 12, wherein the fluid transportation mechanism comprises an exhaust pipe fluidly communicating with the drain opening and a sampling pipe fluidly communicating with the exhaust pipe, the liner is at least on an inner surface of the sampling pipe, and the water contact angle of the first coating is greater than a water contact angle of the inner surface of the sampling pipe.

* * * * *